US008902676B2

United States Patent
Jung et al.

(12)

(10) Patent No.: US 8,902,676 B2
(45) Date of Patent: Dec. 2, 2014

(54) WORDLINE COUPLING REDUCTION TECHNIQUE

(75) Inventors: TaeHyung Jung, Santa Clara, CA (US); BokMoon Kang, Dublin, CA (US)

(73) Assignee: SK hynix Inc., Icheon-si (KR)

(*) Notice: Subject to any disclaimer, the term of this patent is extended or adjusted under 35 U.S.C. 154(b) by 246 days.

(21) Appl. No.: 13/457,065

(22) Filed: Apr. 26, 2012

(65) Prior Publication Data
US 2013/0286754 A1    Oct. 31, 2013

(51) Int. Cl.
*G11C 7/10* (2006.01)
*G11C 5/06* (2006.01)
*G11C 16/24* (2006.01)
*G11C 7/12* (2006.01)
*G11C 16/26* (2006.01)
*G11C 8/08* (2006.01)

(52) U.S. Cl.
CPC *G11C 8/08* (2013.01); *G11C 5/063* (2013.01); *G11C 16/24* (2013.01); *G11C 7/12* (2013.01); *G11C 16/26* (2013.01)
USPC ............ 365/189.06; 365/185.18; 365/189.07; 365/230.06

(58) Field of Classification Search
CPC .......... G11C 7/12; G11C 16/24; G11C 16/26; G11C 2213/34
USPC .............. 365/189.06, 189.07, 230.06, 185.18
See application file for complete search history.

(56) References Cited

U.S. PATENT DOCUMENTS

| | | | | |
|---|---|---|---|---|
| 4,914,632 A | * | 4/1990 | Fujishima et al. | 365/200 |
| 5,652,722 A | * | 7/1997 | Whitefield | 365/185.23 |
| 5,835,419 A | * | 11/1998 | Ichimura et al. | 365/189.06 |
| 6,751,126 B2 | * | 6/2004 | Kim | 365/185.18 |
| 8,472,264 B2 | * | 6/2013 | Sato | 365/189.06 |

* cited by examiner

*Primary Examiner* — Pho M Luu
(74) *Attorney, Agent, or Firm* — Kilpatrick Townsend & Stockton LLP

(57) ABSTRACT

A semiconductor memory includes a memory array having memory cells coupled to wordlines and bitlines. Each wordline has a left end and an opposing right end. A first wordline in every two adjacent wordlines has its left end connected to a left row driver and its right end connected to a right clamp circuit, and a second wordline in every two adjacent wordlines has its right end connected to a right row driver and its left end connected to a left clamp circuit, such that when the right clamp circuits are activated, the right clamp circuits clamp the corresponding wordline ends to a predetermined potential, and when the left clamp circuits are activated, the left clamp circuits clamp the corresponding wordline ends to the predetermined potential.

20 Claims, 7 Drawing Sheets ial lines.

WORDLINE COUPLING REDUCTION TECHNIQUE

BACKGROUND

As semiconductor technology continues to advance and device dimensions continue to shrink into deep sub-micron regime, the physical spacing between adjacent signal lines in ICs (integrated circuits) reduces. The reduced spacing in turn increases the capacitive coupling between adjacent signal lines which can lead to functional problems in sensitive circuitry. Thus, there is a need for techniques to eliminate or minimize the adverse impact of coupling between adjacent signal lines.

BRIEF SUMMARY OF THE INVENTION

In accordance with an embodiment of the invention, a semiconductor memory includes a memory array having memory cells coupled to wordlines and bitlines. Each wordline has a left end and an opposing right end. A first wordline in every two adjacent wordlines has its left end connected to a left row driver and its right end connected to a right clamp circuit, and a second wordline in every two adjacent wordlines has its right end connected to a right row driver and its left end connected to a left clamp circuit, such that when the right clamp circuits are activated, the right clamp circuits clamp the corresponding wordline ends to a predetermined potential, and when the left clamp circuits are activated, the left clamp circuits clamp the corresponding wordline ends to the predetermined potential.

In one embodiment, the right and left row drivers are coupled between a supply voltage and a reference potential, and during operation, when a left row driver is activated to drive a wordline, the left clamp circuits are activated to clamp the potential at the left end of the wordlines to which they are connected to the reference potential.

In another embodiment, the left clamp circuits are activated before the left row driver is activated.

In another embodiment, the right clamp circuits are in a deactivated state before and after the left row driver is activated.

In another embodiment, the right clamp circuits are deactivated before the left row driver is activated.

In another embodiment, the right clamp circuits are deactivated before the left row driver is activated.

In another embodiment, the left row drivers form part of a left sub-wordline driver connected to the left ends of one-half of the wordlines, and the right row drivers are connected to a right sub-wordline driver connected to the right ends of the other half of the wordlines. The right clamp circuits are connected to the right ends of the one-half of the wordlines, and the left clamp circuits are connected to the left ends of the other half of the wordlines.

In another embodiment, each of the right clamp circuits includes a pull-down transistor having a control gate coupled to receive a right control signal, and each of the left clamp circuits includes a pull-down transistor having a control gate coupled to receive a left control signal.

In accordance with another embodiment of the invention, a semiconductor memory includes a memory array comprising memory cells coupled to wordlines and bitlines. Each wordline has a left end and an opposing right end. A first wordline in every two adjacent wordlines has its left end connected to a left row driver and its right end connected to a right clamp circuit. A second wordline in every two adjacent wordlines has its right end connected to a right row driver and its left end connected to a left clamp circuit. A method of operating such a semiconductor memory includes: activating a left row driver to drive a corresponding wordline, and clamping the left end of wordlines to which the left clamp circuits are connected to a predetermined potential.

In one embodiment, the right and left row drivers are coupled between a supply voltage and a reference potential, and the predetermined potential is the reference potential.

In another embodiment, the method further includes activating the left clamp circuits before the left row driver is activated.

In another embodiment, the right clamp circuits are in a deactivated state before and after the left row driver is activated.

In another embodiment, the method further includes deactivating the right clamp circuits before the left row driver is activated.

In another embodiment, the method further includes deactivating the right clamp circuits before the left row driver is activated.

In another embodiment, the left clamp circuits are in an activated state before and after the left row driver is activated.

DETAILED DESCRIPTION OF THE INVENTION

Figure 1A:
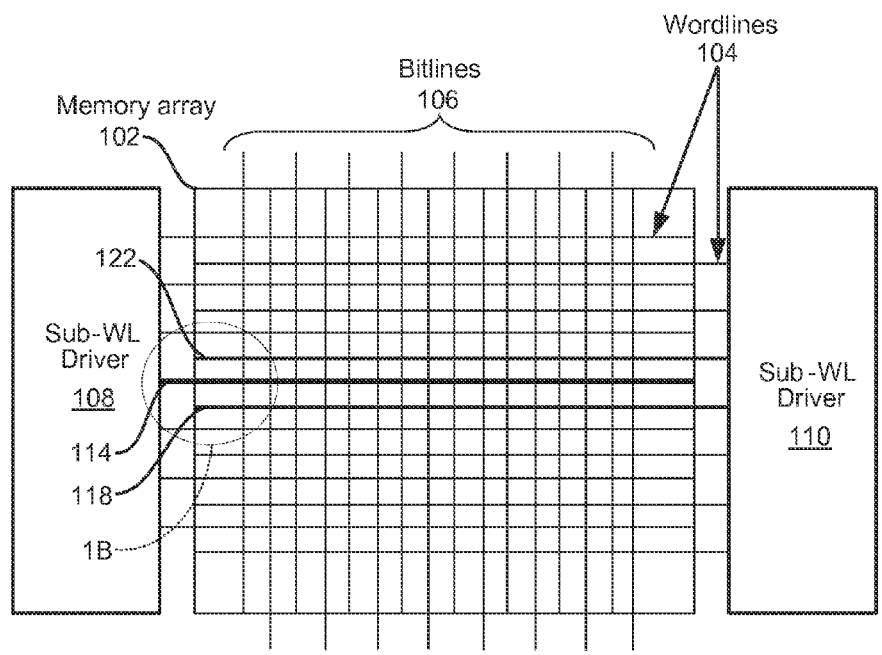
FIG. 1A shows a portion of a semiconductor memory.

FIG. 1A shows a portion of a semiconductor memory which includes memory array 102 having laterally extending wordlines 104 and vertically extending bitlines 106. A memory cell (not shown) is located at each cross point formed by the wordlines and bitlines. Sub-wordline driver block 108 is located along the left end of wordlines 104, and sub-wordline driver block 110 is located along the right end of wordlines 104. Left sub-wordline driver block 108 includes individual wordline drivers (not shown) that are connected to every other wordline, e.g., even numbered wordlines, and right sub-wordline driver block 110 includes individual wordline drivers (not shown) that are connected to every other wordline, e.g., odd numbered wordlines. This configuration advantageously provides equivalent of two wordline pitches within which each wordline driver can be placed or laid out, as compared to one wordline pitch in the conventional configuration where wordline drivers for all wordlines are placed along one end of the wordlines.

Figure 1B:
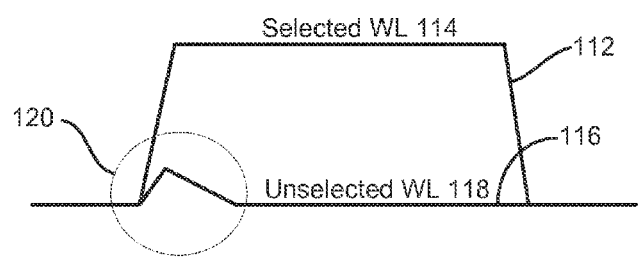
FIG. 1B is a timing diagram showing the wordline coupling during operation of the semiconductor memory in FIG. 1A.

As mentioned earlier, as process technologies continue to advance, the spacing between signal lines such as wordlines reduces, and the capacitive coupling between such lines thus becomes more pronounced. An example of this will be described using the FIG. 1B timing diagram. Waveform 112 represents the signal at the far left end of wordline 114 where wordline 114 is connected to and thus directly driven by a wordline driver (not shown) in left sub-wordline driver block 108. Waveform 116 represents the signal at the far left end of wordline 118 which is the opposite end from where wordline 118 is driven by a wordline driver (not shown) in right sub-wordline driver block 110. The timing diagram in FIG. 1B depicts the operational condition in which wordline 114 is selected and wordline 118 is unselected and thus is expected to remain at low potential during the operation. However, as highlighted by dashed circle 120 in FIG. 1B, when wordline 114 is driven from low to a high, the capacitive coupling from wordline 114 to its adjacent unselected wordline 118 causes the signal integrity at the end of wordline 118 to be compromised. The coupling from selected wordline 114 is strong enough to cause the end of unselected wordline 118 to rise for a period of time despite wordline 118 being forced to the low potential by right sub-wordline driver block 110. A similar phenomenon occurs at the end of unselected wordline 122. Such loss of signal integrity, even though temporary, can cause memory cells to malfunction. For example, in the case of DRAM cells, the temporary rise in the signal on the unselected wordlines can cause leakage in those DRAM cells that are connected at or near the left end of unselected wordlines 118 and 122, which in turn causes problems during refresh operations. That is, during one or more read operations, the temporary rise in the signal on the unselected wordlines may be of sufficient magnitude and/or duration to cause the DRAM cell transistor to leak the charge on the capacitor to the point that the data stored in cell is lost. During a subsequent refresh operation, the affected cells cannot be refreshed to their correct state.

Figure 2A:
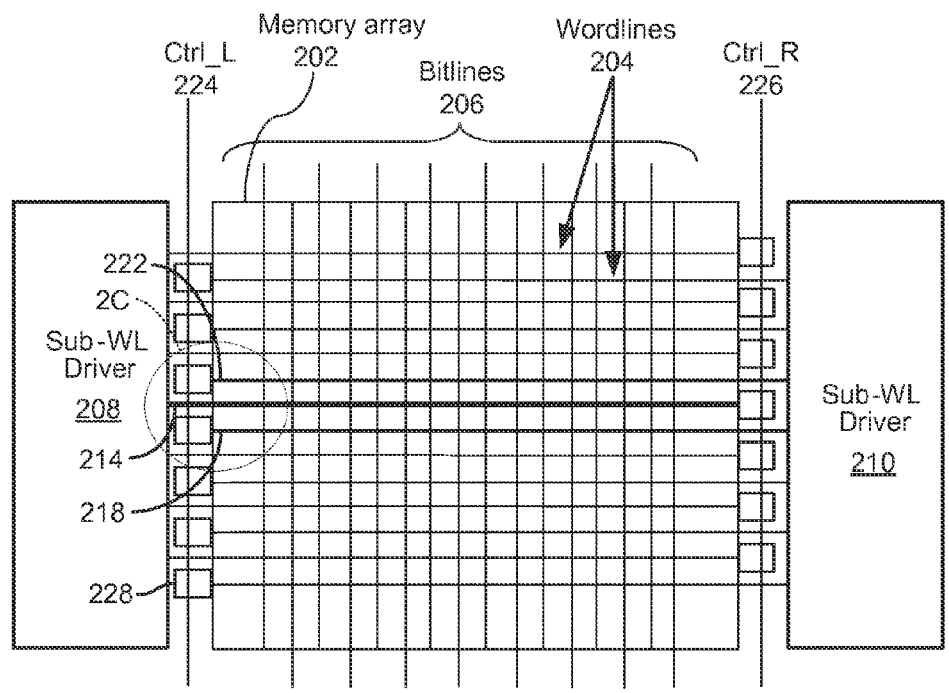
FIG. 2A shows a portion of a semiconductor memory in which pull-down transistors are added to the ends of wordlines to eliminate or reduce the wordline coupling.
Figure 2B:
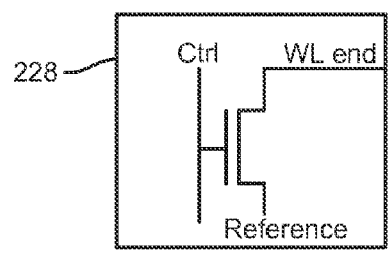
FIG. 2B shows the circuit schematic for the pull-down transistor used in the semiconductor memory in FIG. 2A.
Figure 2C:
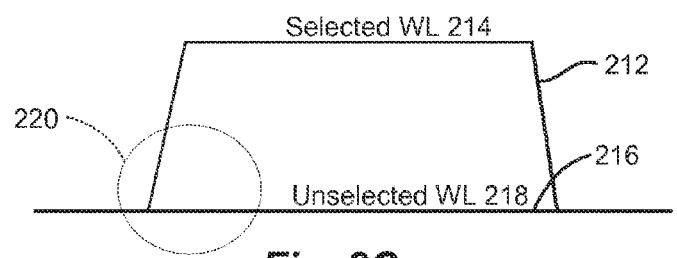
FIG. 2C is a timing diagram showing the impact of the pull-down transistor on the wordline coupling during operation of the semiconductor memory in FIG. 2A.

FIGS. 2A, 2B and 2C will be used to describe a technique for addressing the problem caused by the above coupling effect. FIG. 2A is similar to FIG. 1A except that clamp circuits represented by blocks 228 are added to the ends of all the wordlines. FIG. 2B shows details of a clamp circuit 228, which is an NMOS transistor with its gate connected to a control signal Ctrl, its drain connected to the end of a wordline, and its source connected to a reference voltage. In some embodiments, the reference voltage is ground potential or 0V, and in other embodiments, the reference voltage is a negative potential, for example, −0.3V. As can be seen in FIG. 1A, clamp circuits 228 are connected to the ends of the wordlines opposite the ends at which the wordlines are connected to row drivers. The clamp circuits connected to the left-end of alternate wordlines are controlled by control signal Ctrl_L 224, and the clamp circuits connected to the right-end of alternate wordlines are controlled by control signal Ctrl_R 226.

Referring to FIG. 2C, waveform 212 represents the signal at the far left end of wordline 214 where wordline 214 is connected to and thus directly driven by a row driver (not shown) in left sub-wordline driver block 208. Waveform 216 represents the signal at the far left end of wordline 218 which is the opposite end from where wordline 218 is driven by a row driver (not shown) in right sub-wordline driver block 210. The timing diagram in FIG. 2C depicts the operational condition in which wordline 214 is selected, wordline 218 is unselected, control signal Ctrl_L 224 is raised high to turn on pull-down transistors 228 located along the left end of alternate wordlines, and control signal Ctrl_R 226 is kept at low potential to keep clamp circuits 228 located along the right end of alternate wordlines in the off state. As highlighted by dashed circle 220 in FIG. 2C, contrary to that seen in FIG. 1B, when wordline 214 is driven from low to high, the capacitive coupling from wordline 214 to its adjacent unselected wordlines 218 and 222 has no impact on the signal integrity at the ends of wordlines 218 and 222. This is because the left side pull-down transistors 228 controlled by Ctrl_L 224 are on and thus force the ends of wordlines to which they are connected to the low reference potential. Therefore, the leakage problem and the resulting refresh problems caused by capacitive coupling between wordlines are eliminated.

Figure 3A:
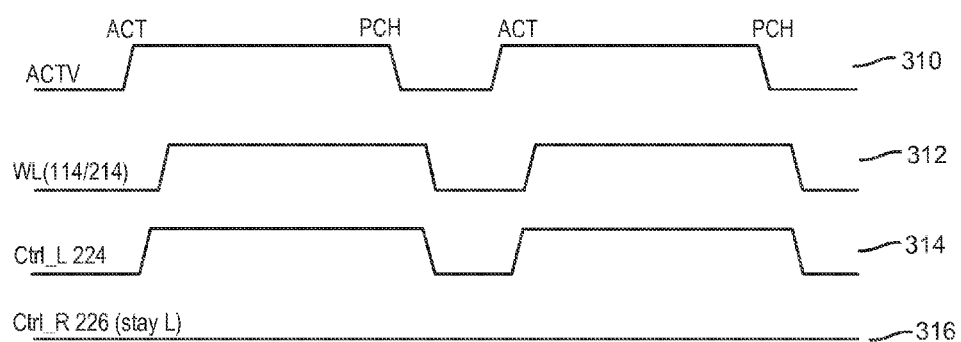
FIGS. 3A and 3B are timing diagrams showing two successive active cycles for two timing embodiments.

The timing diagram in FIG. 3A corresponds to that shown in FIG. 2C but also includes waveforms for control signals Ctrl_L 224 and Ctrl_R 226, and shows two successive active cycles. Waveform 310 represents internal signal ACTV, showing two successive active cycles with a precharge cycle in between. Waveform 312 corresponds to waveform 212 in FIG. 2C, and represents the signal at the end of wordline 214. As can be seen by waveform 312, wordline 214 is selected in the early part of each of the two successive active cycles and deselected near the end of each of the two active cycles. Control signal Ctrl_L 224, represented by waveform 314, is activated and deactivated in each of the two cycles in concert with wordline 214, while control signal Ctrl_R 226, represented by waveform 316, is kept at low potential throughout both active cycles. In this embodiment, the left control signal Ctrl_L 224 is activated (raised high) when the left sub-wordline driver block 208 selects and drives a wordline high, and the right control signal Ctrl_R 226 is activated (raised high) when the right sub-wordline driver block 210 selects and drives a wordline high. In the exemplary timing diagram shown in FIG. 3A, it is important that the left-side pull-down transistors are turned on before wordline 214 starts the low to high transition. That is, left control signal Ctrl_L 224 is activated before wordline 214 starts the low to high transition. This insures that the coupling from wordline 214 to its adjacent unselected wordlines is properly suppressed. In an alternate embodiment, activated control signal Ctrl_L 224 is not deactivated at the end of the cycle, and in the subsequent active cycle it is maintained in the activated state unless a row driver in right sub-wordline driver 210 is selected, in which case control signal Ctrl_L is deactivated and control signal Ctrl_R 226 is activated.

Figure 3B:
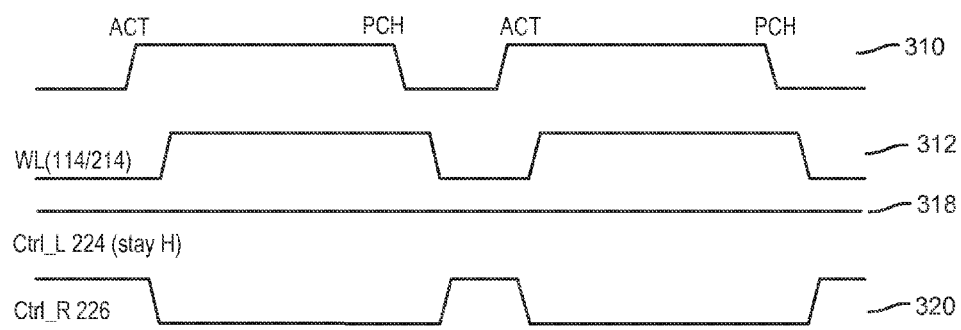

In yet another embodiment depicted by the FIG. 3B timing diagram, at the beginning of each active cycle, both control signals Ctrl_L 224 and Ctrl_R 226 are high so that both the right-side and the left-side pull-down transistors are on. Depending on which of the left and right sub-wordline drivers selects a wordline, the opposite side pull-down transistors are deactivated. That is, if a row driver in left sub-wordline driver block 208 is activated, control signal Ctrl_R 226 is deselected in order to turn off the right-side pull-down transistors. Conversely, if a row driver in right sub-wordline driver block 210 is activated, control signal Ctrl_L 224 is deselected in order to turn off the left side pull-down transistors. The exemplary timing diagram in FIG. 3B shows the case where the row driver in left sub-wordline driver block 208 connected to wordline 214 is selected and thus wordline 214 transitions from low to high. Accordingly, control signal Ctrl_R 226 is deselected so that the right-side pull-down transistors are turned off, while control signal Ctrl_L 224 is maintained in the high state so that the left-side pull-down transistors remain on. As can be seen, near the end of each active cycle, upon deselecting wordline 214, control signal Ctrl_R 226 is raised back high so that the right-side pull-down transistors are turned on in preparation for the next active cycle. In the exemplary timing diagram shown in FIG. 3B, the right-side pull-down transistors are turned off before wordline 214 is selected. That is, right control signal Ctrl_R 226 is deselected before wordline 214 starts the low to high transition. This insures that no current flows from the power supply through the selected row driver, through wordline 214, and into the pull-down transistor connected to the right end of wordline 214. Thus, no transient power is consumed. Similarly, near the end of the active cycle, wordline 214 is deselected before control signal Ctrl_R 226 is selected in order to avoid unnecessary transient power consumption. In an alternate embodiment, the deselected control signal Ctrl_R 226 is not selected at the end of the cycle, and in the subsequent active cycle it is maintained in the deselected state unless a row driver in right sub-wordline driver 208 is selected, in which case control signal Ctrl_L 224 is deselected and control signal Ctrl_R 226 is selected.

Figure 4A:
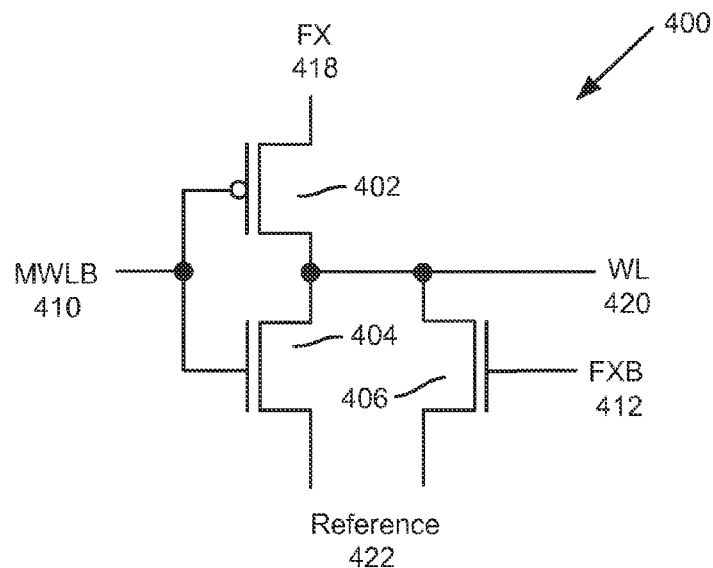
FIGS. 4A and 4B respectively show an exemplary circuit diagram for a row driver circuit connected to each wordline for driving the wordline, and a timing diagram showing the operation of the row driver circuit.
Figure 4B:
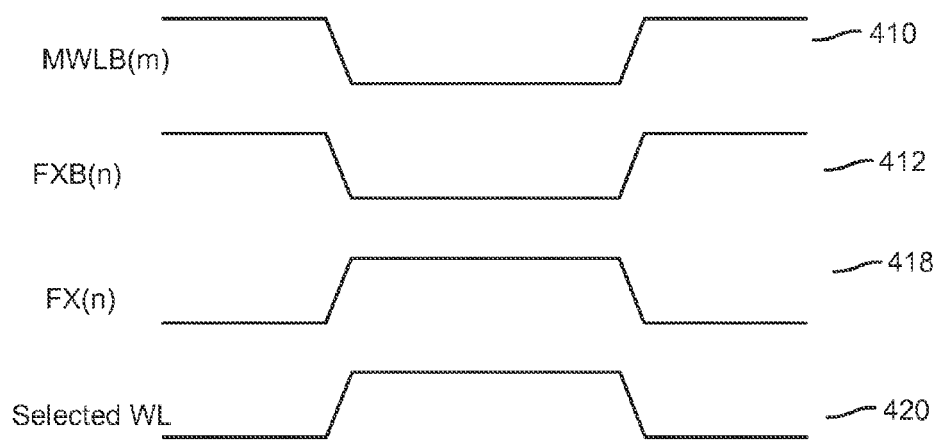

FIGS. 4A and 4B respectively show an exemplary circuit diagram for a row driver circuit 400 connected to each wordline for driving the wordline, and a timing diagram showing the operation of row driver circuit 400. Row driver circuit 400 includes PMOS transistor 402 and NMOS transistor 404 connected together to form an inverter that is coupled between decode signal FX 418 and Reference potential 422. The input of the inverter is driven by MWLB signal 410 which is provided by the main row decoder, and the output of the inverter is connected to wordline WL 420. NMOS transistor 406 is connected between wordline WL 420 and Reference potential 422, and its gate is connected to predecode signal FXB 412. Predecode signals FX 418 and FXB 412 are complementary signals. The FIG. 4B timing diagram shows a portion of an active cycle. Wordline WL (represented by waveform 420) is selected when the corresponding MWLB signal (represented by waveform 410) and FXB signals (represented by waveform 412) go low, and the corresponding predecode signal FX (represented by waveform 418) goes high. Thus, row driver 400 operates as a driver for driving the wordline and also performs decoding function.

Figure 5A:
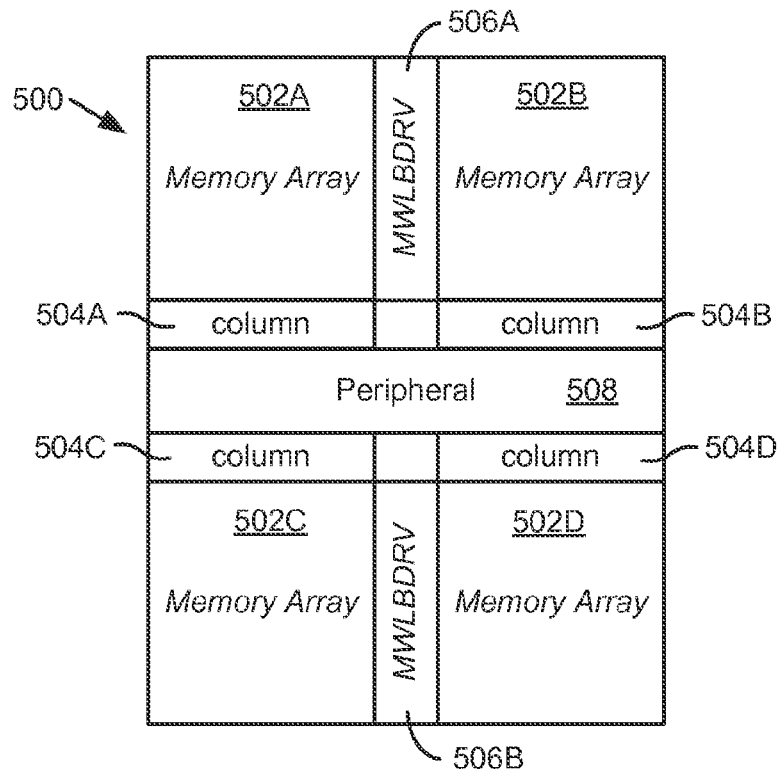
FIGS. 5A, 5B and 5C respectively show a top view of a memory device having four memory arrays, the details of one of the four memory arrays, and a memory sub-arrays with its attendant left and right sub-wordline driver blocks.

FIG. 5A shows a top view of a memory device 500 in which the clamping technique described above in connection with FIGS. 2A-2C is implemented. Memory device 500 includes four memory arrays 502A, 502B, 502C and 502D. The top two arrays 502A and 502B are separated by main wordline decoder block 506A, and the bottom two memory arrays 502C and 502D are separated by main wordline decoder block 506B. Each of memory arrays 502A-502D has a corresponding column decoder 504A-504D. A peripheral region 508 separating the upper two memory arrays from the bottom two memory arrays includes the peripheral circuitry.

Figure 5B:
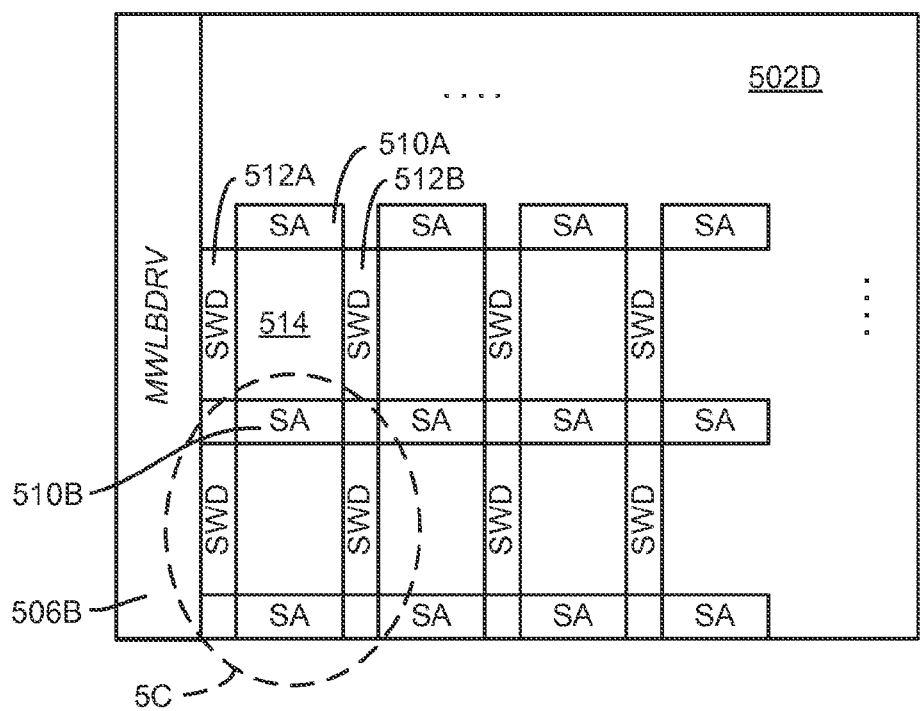
Figure 5C:
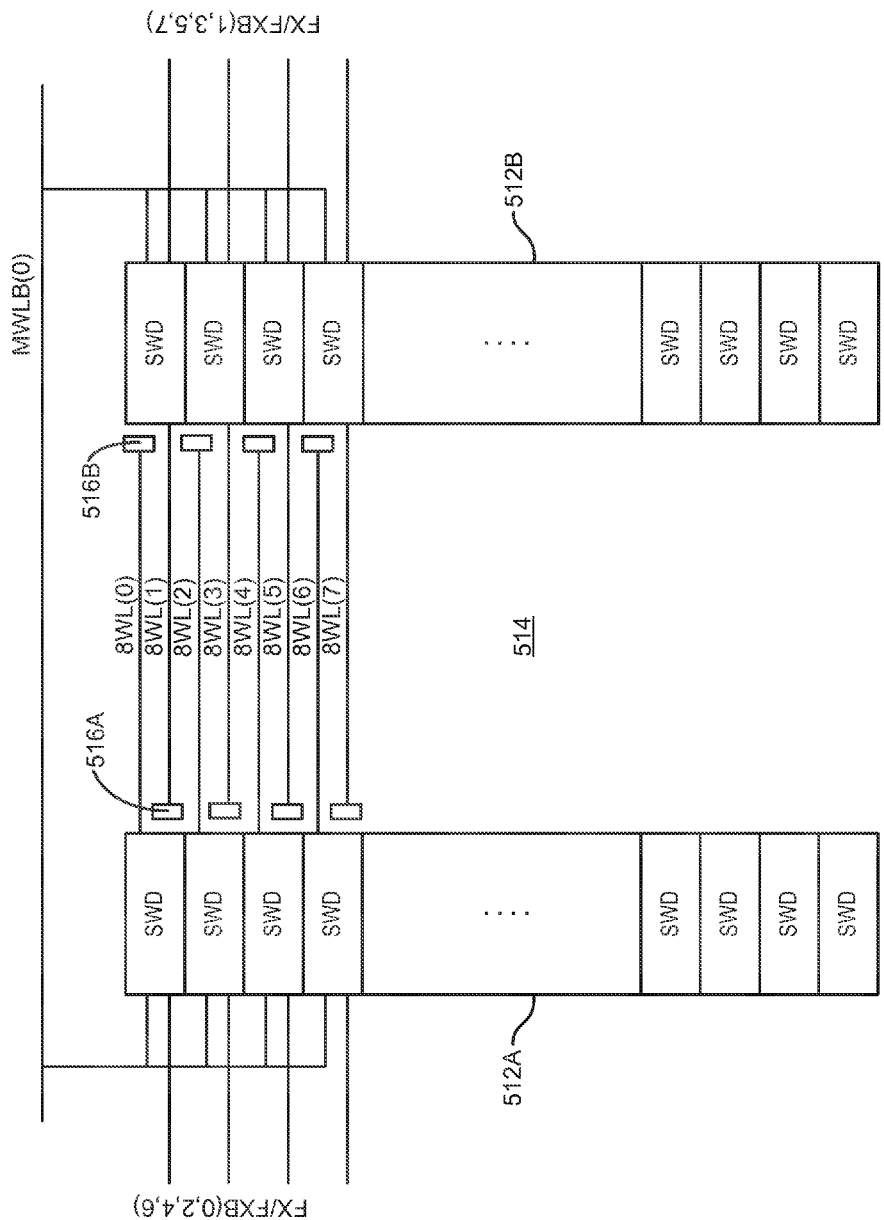

FIG. 5B shows the details of one of the four memory arrays. Each memory array is made up of a number of memory sub-arrays 514 each with its attendant left and right sub-wordline driver blocks SWD 512A, 512B and local sense amplifier blocks SA 510A, 510B. FIG. 5C in turn shows one of the memory sub-arrays 514 and its attendant left and right sub-wordline driver blocks SWD 512A, 512B. The left SWD 512A block is coupled to receive the even FX and FXB decode signals at its inputs, and has outputs connected to the even numbered wordlines. The right SWD block 512B is coupled to receive the odd FX and FXB decode signals at its inputs, and has outputs connected to the odd numbered wordlines. Each of the even wordlines has a clamp circuit 516B connected to its right end, and each of the odd wordlines has a clamp circuit 516A connected to its left end. The control signals for activating the right or the left clamp circuits 516A, 516B are not shown. Signal MWL(0) generated by main wordline decoder 506B is coupled to activate (or deactivate) both sub-wordline driver blocks SWD 512A, 512B. Row decode signals FX and FXB in turn activate one of the row drivers in the right or left SWD block 512A, 512B in order to select the corresponding wordline. If one of the row drivers in the right SWD block 512B is activated to select one of the odd numbered wordlines, the right clamp circuits 516B are activated. If one of the row drivers in the left SWD block 512A is activated to select one of the even numbered wordlines, the left clamp circuits 516A are activated. The various possible timings in activating or de-activating various circuit blocks described above in connection with FIGS. 2A-2C and 3A-3B apply here as well.

Figure 6A:
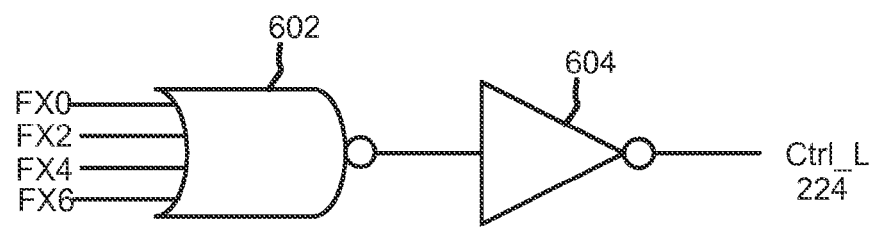
FIGS. 6A and 6B show exemplary logic diagrams for the control circuitry that generates control signals Ctrl_L and Ctrl_R.
Figure 6B:
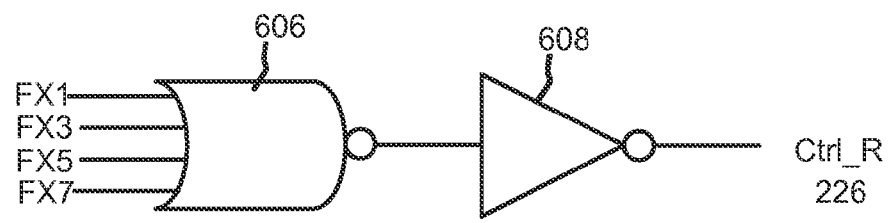

FIGS. 6A and 6B show exemplary logic diagrams for the control circuitry that generates control signals Ctrl_L 224 and Ctrl_R 226 (FIG. 2A). In FIG. 6A, the even FX decode signals FX0, FX2, FX4, FX6 (also shown in FIG. 5C being coupled to the left SWD block 512A) are provided to respective inputs of a four-input NOR gate 602, and the output of NOR gate 602 is connected to the input of inverter 604. The output of inverter 604 in turn provides Ctrl_L signal 224 which is coupled to the left-side clamp circuits (e.g., to clamp circuits 516A in FIG. 5C). In FIG. 6B, the odd FX decode signals FX1, FX3, FX5, FX7 (also shown in FIG. 5C being coupled to the right SWD block 512B) are provided to respective inputs of another four-input NOR gate 606, and the output of NOR gate 606 is connected to the input of inverter 608. The output of inverter 608 in turn provides Ctrl_R signal 226 which is coupled to the right-side clamp circuits (e.g., to clamp circuits 516B in FIG. 5C). When any one of the odd and even FX signals is selected and thus goes high, the corresponding Ctrl_L/R signal goes high thus activating the corresponding clamp circuits. For example, if FX0 goes high (i.e., a wordline driver in the left SWD block 512A is activated), Ctrl_L 224 signal goes high thus activating the left clamp circuits 516A in FIG. 5C.

The logic diagrams in FIGS. 6A and 6B are exemplary and are provided to illustrate a logic implementation for generating Ctrl_L 224 and Ctrl_R 226 signals. Modifying these logic diagrams in order to implement the various timing embodiments described above in connection with the FIGS. 3A and 3B timing diagrams would be obvious to one skilled in the art in view of this disclosure.

While the invention has been described in the context of certain embodiments, the scope of the invention is not limited to these embodiments. For example, the clamp technique disclosed herein for reducing wordline coupling is not limited to the particular array configurations shown in the various figures, and can be implemented in other memory array configurations. Further, the technique may be implemented in any type of memory device such as DRAMs, SRAMs, and nonvolatile memories including flash EPROMs, EEPROMs, and fuse-based memories.

What is claimed is:

1. A semiconductor memory comprising a memory array having memory cells coupled to wordlines and bitlines, each wordline having a left end extending out a left side of the memory array and an opposing right end extending out a right side of the memory array, a first wordline in every two adjacent wordlines having its left end connected to a left row driver located on the left side of the memory array and having its right end connected to a right clamp circuit located on the right side of the memory array, and a second wordline in every two adjacent wordlines having its right end connected to a right row driver located on the right side of the memory array and having its left end connected to a left clamp circuit located on the left side of the memory array,
- wherein the right clamp circuits are configured to selectively connect the first wordlines to a reference potential based on a right control signal, and
- wherein the left clamp circuits are configured to selectively connect the second wordlines to the reference potential based on a left control signal.

2. The semiconductor memory of claim 1 wherein the right and left row drivers are coupled between a supply voltage and a reference potential, and during operation, when a left row driver is activated to drive a wordline, the left clamp circuits are activated to clamp the potential at the left end of the wordlines to which they are connected to the reference potential.

3. The semiconductor memory of claim 2 wherein the left clamp circuits are activated before the left row driver is activated.

4. The semiconductor memory of claim 3 wherein the right clamp circuits are in a deactivated state before and after the left row driver is activated.

5. The semiconductor memory of claim 3 wherein the right clamp circuits are deactivated before the left row driver is activated.

6. The semiconductor memory of claim 2 wherein the right clamp circuits are deactivated before the left row driver is activated.

7. The semiconductor memory of claim 6 wherein the left clamp circuits are in an activated state before and after the left row driver is activated.

8. The semiconductor memory of claim 6 wherein the left clamp circuits are activated before the left row driver is activated.

9. The semiconductor memory of claim 2 wherein the left row drivers form part of a left sub-wordline driver connected to the left ends of one-half of the wordlines, and the right row drivers form part of a right sub-wordline driver connected to the right ends of the other half of the wordlines, and the right clamp circuits are connected to the right ends of the one-half of the wordlines, and the left clamp circuits are connected to the left ends of the other half of the wordlines.

10. The semiconductor memory of claim 9 wherein each of the right clamp circuits includes a pull-down transistor having a control gate coupled to receive a right control signal, and each of the left clamp circuits includes a pull-down transistor having a control gate coupled to receive a left control signal.

11. The semiconductor memory of claim 10 wherein when a left row driver in the left sub-wordline driver is activated to drive a corresponding wordline, the left control signal is activated to turn on the left pull-down transistors.

12. The semiconductor memory of claim 10 wherein when a left row driver in the left sub-wordline driver is activated to drive a corresponding wordline, the right control signal is deactivated to turn off the right pull-down transistors.

13. A method of operating a semiconductor memory having a memory array comprising memory cells coupled to wordlines and bitlines, each wordline having a left end extending out a left side of the memory array and an opposing right end extending out a right side of the memory array, a first wordline in every two adjacent wordlines having its left end connected to a left row driver and its right end connected to a right clamp circuit located on the right side of the memory array, and a second wordline in every two adjacent wordlines having its right end connected to a right row driver and its left end connected to a left clamp circuit located on the left side of the memory array, the method comprising:
- activating a left row driver to drive a corresponding wordline; and
- in response to a left control signal, selectively activating one or more of the left clamp circuits to connect a reference potential to one or more wordlines adjacent to the corresponding wordline.

14. The method of claim 13 wherein the right and left row drivers are coupled between a supply voltage and a reference potential, and the predetermined potential is the reference potential.

15. The method of claim 14 further comprising:
- activating the left clamp circuits before the left row driver is activated.

16. The method of claim 14 wherein the right clamp circuits are in a deactivated state before and after the left row driver is activated.

17. The method of claim 15 further comprising:
- deactivating the right clamp circuits before the left row driver is activated.

18. The method of claim 14 further comprising:
- deactivating the right clamp circuits before the left row driver is activated.

19. The method of claim 18 wherein the left clamp circuits are in an activated state before and after the left row driver is activated.

20. The method of claim 18 further comprising:
- activating the left clamp circuits before the left row driver is activated.

* * * * *